United States Patent
Huang et al.

(10) Patent No.: US 9,799,615 B1
(45) Date of Patent: Oct. 24, 2017

(54) PACKAGE STRUCTURES HAVING HEIGHT-ADJUSTED MOLDING MEMBERS AND METHODS OF FORMING THE SAME

(71) Applicant: Taiwan Semiconductor Manufacturing Co., Ltd., Hsinchu (TW)

(72) Inventors: Chang-Pin Huang, Taoyuan (TW); Chung-Shi Liu, Hsinchu (TW); Hsien-Ming Tu, Hsinchu County (TW); Hung-Yi Kuo, Taipei (TW); Hao-Yi Tsai, Hsinchu (TW); Shih-Wei Liang, Taichung (TW); Yu-Chia Lai, Miaoli County (TW); Ren-Xuan Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/214,466

(22) Filed: Jul. 20, 2016

(51) Int. Cl.
*H01L 23/00* (2006.01)
*H01L 21/56* (2006.01)

(52) U.S. Cl.
CPC .......... *H01L 24/02* (2013.01); *H01L 21/566* (2013.01); *H01L 24/05* (2013.01); *H01L 24/13* (2013.01); *H01L 2224/02315* (2013.01); *H01L 2224/02331* (2013.01); *H01L 2224/02351* (2013.01); *H01L 2224/02373* (2013.01);
(Continued)

(58) Field of Classification Search
CPC ....... H01L 24/02; H01L 21/566; H01L 24/05; H01L 24/13; H01L 2224/02315; H01L 2224/02331; H01L 2224/02351; H01L 2224/02373; H01L 2224/02379; H01L 2224/0401; H01L 2224/05024; H01L 2224/13026; H01L 23/28; H01L 23/31; H01L 23/3157; H01L 23/3171; H01L 23/3185; H01L 2224/023; H01L 2224/0231; H01L 2224/0233; H01L 2224/0237; H01L 2224/02372; H01L 2224/04105; H01L 2224/13027
See application file for complete search history.

(56) References Cited

U.S. PATENT DOCUMENTS 8,361,842 B2    1/2013  Yu et al.
8,680,647 B2    3/2014  Yu et al.
(Continued)

*Primary Examiner* — Scott B Geyer
(74) *Attorney, Agent, or Firm* — JCIPRNet

(57) ABSTRACT

Package structures and methods of forming the same are disclosed. A package structure includes a die, a molding member and a redistribution circuit structure. The die includes a semiconductor substrate, a connector and a passivation layer. The semiconductor substrate has a top surface. The connector is disposed over the top surface of the semiconductor substrate. The passivation layer is disposed over the top surface of the semiconductor substrate and exposes a portion of the connector. The molding member laterally surrounds the semiconductor substrate, wherein a top surface of the molding member is higher than the top surface of the semiconductor substrate and the molding member forms a hooking structure that embraces over an edge portion of the semiconductor substrate. The redistribution circuit structure extends over the passivation layer and the molding member, and is electrically connected to the connector.

19 Claims, 13 Drawing Sheets

(52) U.S. Cl.
CPC ............... *H01L 2224/02379* (2013.01); *H01L 2224/0401* (2013.01); *H01L 2224/05024* (2013.01); *H01L 2224/13026* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0108634 A1* | 4/2015 | Liu .................... H01L 24/13 257/737 |

* cited by examiner

PACKAGE STRUCTURES HAVING HEIGHT-ADJUSTED MOLDING MEMBERS AND METHODS OF FORMING THE SAME

BACKGROUND

In the integrated circuit manufacturing process, integrated circuit devices, such as transistors, are first formed at the surface of a semiconductor substrate. An interconnect structure is then formed over the integrated circuit devices. Metal connectors are formed over and electrically coupled to the interconnect structure. A passivation layer and a polymer layer are formed over the metal connectors, with the metal connectors exposed through the openings in the passivation layer and the polymer layer. A molding compound is formed aside the semiconductor substrate. A redistribution circuit structure is then formed over the molding compound and the polymer layer, which includes redistribution lines connected to the metal connectors.

Since a height difference is present between the polymer layer and the molding compound, the redistribution lines of the redistribution circuit structure formed thereover may be easily broken during temperature cycling. Therefore, there are many challenges related to configuring the redistribution line with a fine width and/or a thin thickness.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
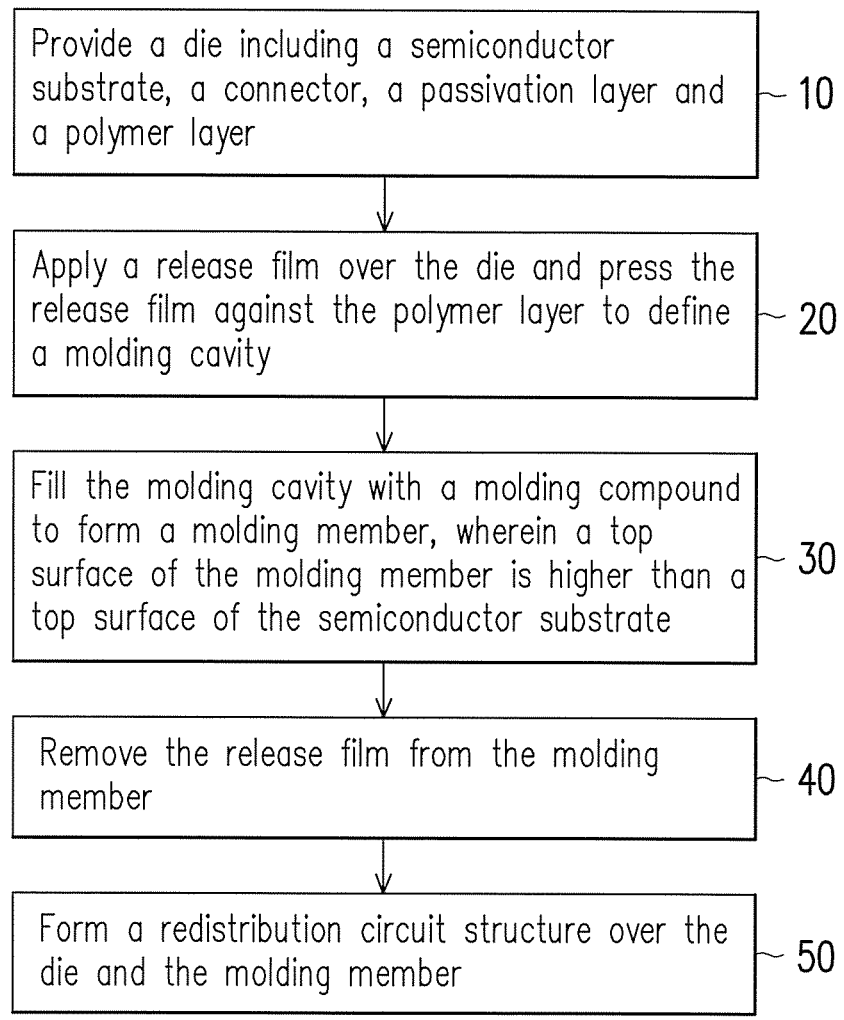
FIG. 1 illustrates a flow chart of a method of forming a package structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "on", "above", "upper" and the like, may be used herein to facilitate the description of one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

FIG. 1 illustrates a flow chart of a method of forming a package structure in accordance with some embodiments. FIG. 2A to FIG. 2F illustrate cross-sectional views of a method of forming a package structure in accordance with some embodiments.

Figure 2A:
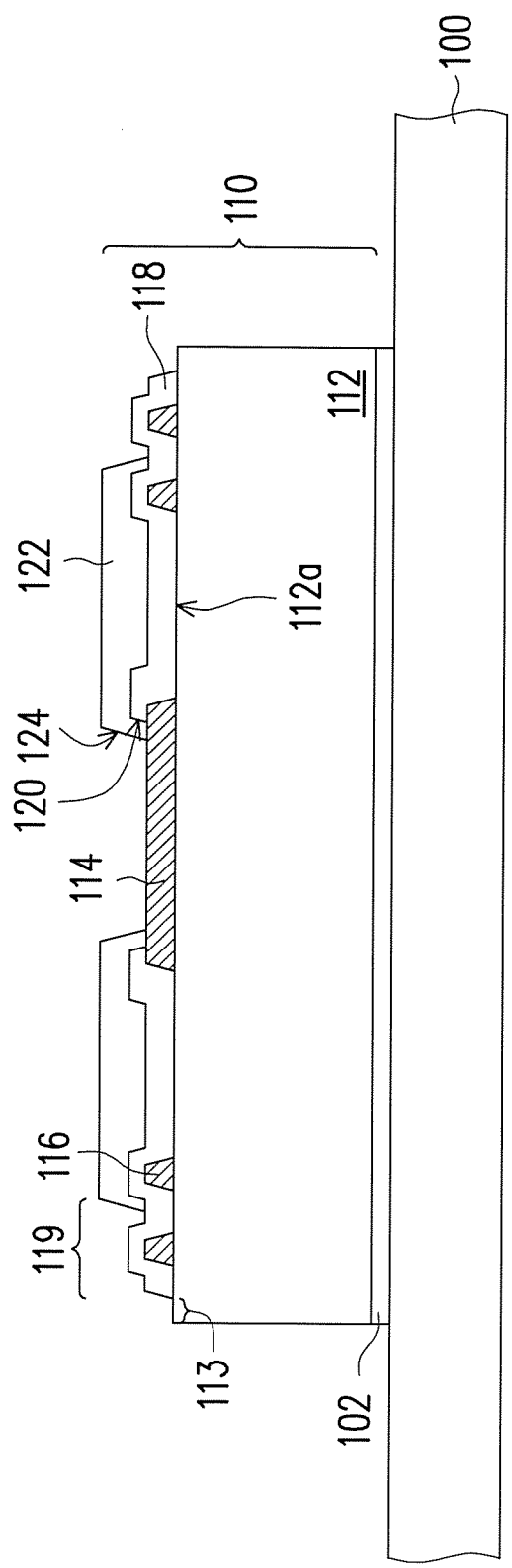
FIG. 2A to FIG. 2F illustrate cross-sectional views of a method of forming a package structure in accordance with some embodiments.

Referring to FIG. 1 and FIG. 2A, at step 10, a die 110 is provided. In some embodiments, the die 110 is placed on a carrier 100. In some embodiments, the carrier 100 is a glass carrier. However, other material may be adapted as a material of the carrier 100 as long as the material is able to withstand the subsequent processes while carrying the package structure formed thereon. In some embodiments, the die 110 is provided with a glue layer 102 to enhance the adhesion between the die 110 and the carrier 100. In some embodiments, the glue layer 102 is formed of an adhesive such as a die attach film (DAF), epoxy, silver paste, or the like, although other types of adhesives may be used. It should be noted that depending on the application, if the die 110 is required to be separate from the carrier 100 in the subsequent processes, a de-bonding layer such as a LTHC (light to heat conversion) release layer may be formed between the die 110 and the carrier 100. For example, the de-bonding layer may be irradiated by an UV laser such that the die 110 is peeled from the carrier 100.

In some embodiments, the die 110 includes a semiconductor substrate 112, a connector 114, a passivation layer 118 and a polymer layer 122. In some embodiments, the glue layer 102 is formed between a bottom surface of the semiconductor substrate 112 and the carrier 100. The semiconductor substrate 112 may be a semiconductor substrate, such as a silicon substrate, although it may be formed of other semiconductor materials including, and not limited to, silicon germanium, silicon carbon, gallium arsenide, or the like. In some embodiments, the semiconductor substrate 112 includes integrated circuit devices (not shown) and interconnect structures (not shown). In some embodiments, the integrated circuit devices include transistors, resistors, capacitors, inductors, and/or the like. The interconnect structures include conductive lines and vias. The conductive lines and vias are electrically coupled to the integrated circuit devices. The conductive lines and vias may be formed of copper or copper alloys, and may be formed using damascene processes. The interconnect structures may include a plurality of dielectric layers, which may include an Inter-Layer Dielectric (ILD) and Inter-Metal Dielectrics (IMDs), with the conductive lines and vias disposed in the dielectric layers. In alternative embodiments, the semiconductor substrate 112 is substantially free from integrated circuit devices therein.

The connector 114 is formed over a top surface 112a of the semiconductor substrate 112. The connector 114 may include a conductive pad (e.g., an aluminum pad, a copper pad or the like), a conductive pillar (e.g., a solder pillar, a gold pillar, a copper pillar or the like), a conductive bump (e.g., a reflowed solder bump, a gold bump, a copper bump or the like) or the combinations thereof. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The connector 114 may be electrically coupled to the interconnect structure, for example, through the metal lines and vias. In some embodiments, the die 110 further includes seal rings 116 formed over the top surface 112a of the semiconductor substrate 112. In some embodiments, a material of the seal rings 116 is the same as the connector 114. In some embodiments, the seal rings 116 are formed simultaneously with the connector 114. In alternative embodiments, a material of the seal rings 116 is different from the connector 114.

The passivation layer 118 is formed over the semiconductor substrate 112 and the connector 114 while exposing at least part of the connector 114. In some embodiments, the passivation layer 118 is formed to cover an edge portion of the connector 114. In some embodiments, the passivation layer 118 covers completely the seal rings 116. In some embodiments, the passivation layer 118 includes a silicon oxide layer and a silicon nitride layer over the silicon oxide layer, although other dielectric materials such as Un-doped Silicate Glass (USG) may be used. In some embodiments, a thickness of the passivation layer 118 ranges from 1 to 1.9 um. In some embodiments, an opening 120 is formed in passivation layer 118, and hence the central portion of the connector 114 is exposed through the opening 120. In some embodiments, the passivation layer 118 is also patterned to expose a portion of the top surface 112a of the semiconductor substrate 112, such as an edge portion 113 of the top surface 112a of the semiconductor substrate 112. In alternative embodiments, the edge portion 113 and/or other portions of the top surface 112a of the semiconductor substrate 112 is covered the passivation layer 118.

In some embodiments, the polymer layer 122 is formed over the passivation layer 118, wherein the polymer layer 122 extends into the opening 120 in the passivation layer 118. In some embodiments, the opening 124 is disposed in the opening 120, and a size of the opening 124 is smaller than the opening 120. In some embodiments, a material of the polymer layer 122 is different form the passivation layer 11S. The polymer layer 122 may include a photo sensitive material in accordance with some embodiments. For example, the material of the polymer layer 122 includes, and is not limited to, polyimide (PI), polybenzoxazole (PBO), and the like. In some embodiments, a thickness of the polymer layer 122 ranges from 4.5 to 5.5 um. The polymer layer 122 is patterned to form an opening 124, so that the connector 114 is exposed. In addition, an edge portion 119 of the passivation layer 118 is also exposed by the polymer layer 122. In alternative embodiments, the edge portion 119 and/or other portions of the passivation layer 118 is covered the polymer layer 122. In alternative embodiments, the polymer layer 122 may not extend into the opening 120 in the passivation layer 118, and expose a portion of the passivation layer 118 near the opening 120. In other words, in alternative embodiments, a size of the opening 124 may be larger than the opening 120.

Figure 2B:
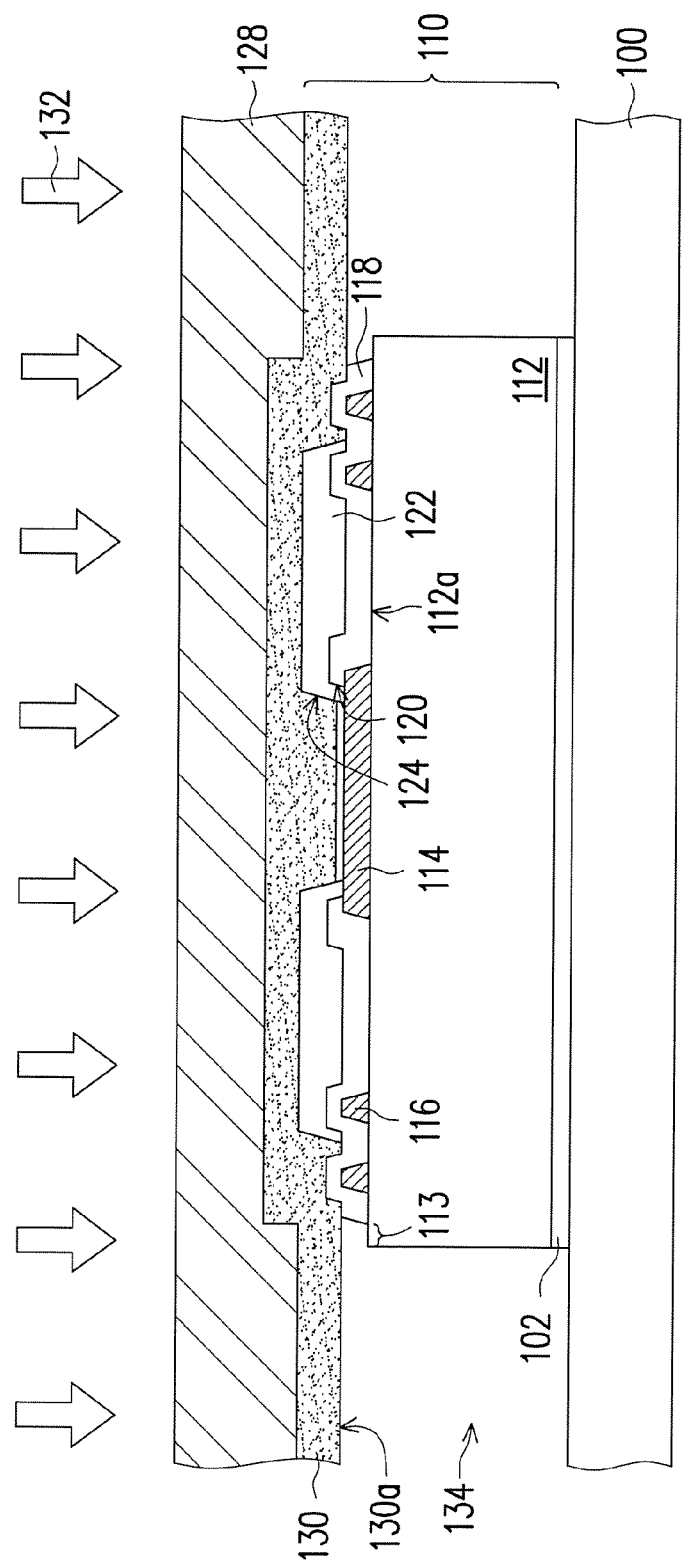

Referring to FIG. 1 and FIG. 2B, at step 20, a release film 130 is applied over the die 110 and is pressed against the polymer layer 122 to define a molding cavity 134. In some embodiments, the molding cavity 134 is defined by or between the release film 130, the passivation layer 118, the semiconductor substrate 112 and the carrier 100. In detail, the molding cavity 134 is defined by a lower surface 130a of the release film 130, a sidewall of the passivation layer 118, a sidewall of the semiconductor substrate 112 and a top surface of the carrier 100. In some embodiments, a part of mould 128, which is part of compressive molding apparatus, is illustrated, and the release film 130 is placed on the mould 128. The mould 128 is configured to be heated to desirable temperatures. The release film 130 is formed of a relatively soft material, so that when the top portion of the polymer layer 122 are pressed into it, the top portion of the polymer layer 122 are not damaged, and the top portion of the polymer layer 122 may substantially maintain its outline. The release film 130 may be a fluorine-base film, a silicon-coated polyethylene terephthalate film, a polymethylpentene film, a polypropylene film, or the like. In some embodiments, a pressure, as shown as an arrow 132, is applied on the mould 128, so that the top portion of the polymer layer 122 is pressed into the release film 130. In some embodiments, by controlling the pressure applying to the mould 128, a lower surface 130a of the release film 130 is disposed above the top surface 112a of the semiconductor substrate 112. In some embodiments, the lower surface 130a of the release film 130 above the edge portion 113 of the semiconductor substrate 112 is above the top surface 112a of the semiconductor substrate 112. In alternative embodiments, the lower surface 130a of the release film 130 away from the die 110 may be lower than the lower surface 130a of the release film 130 close to the die 110.

Figure 2C:
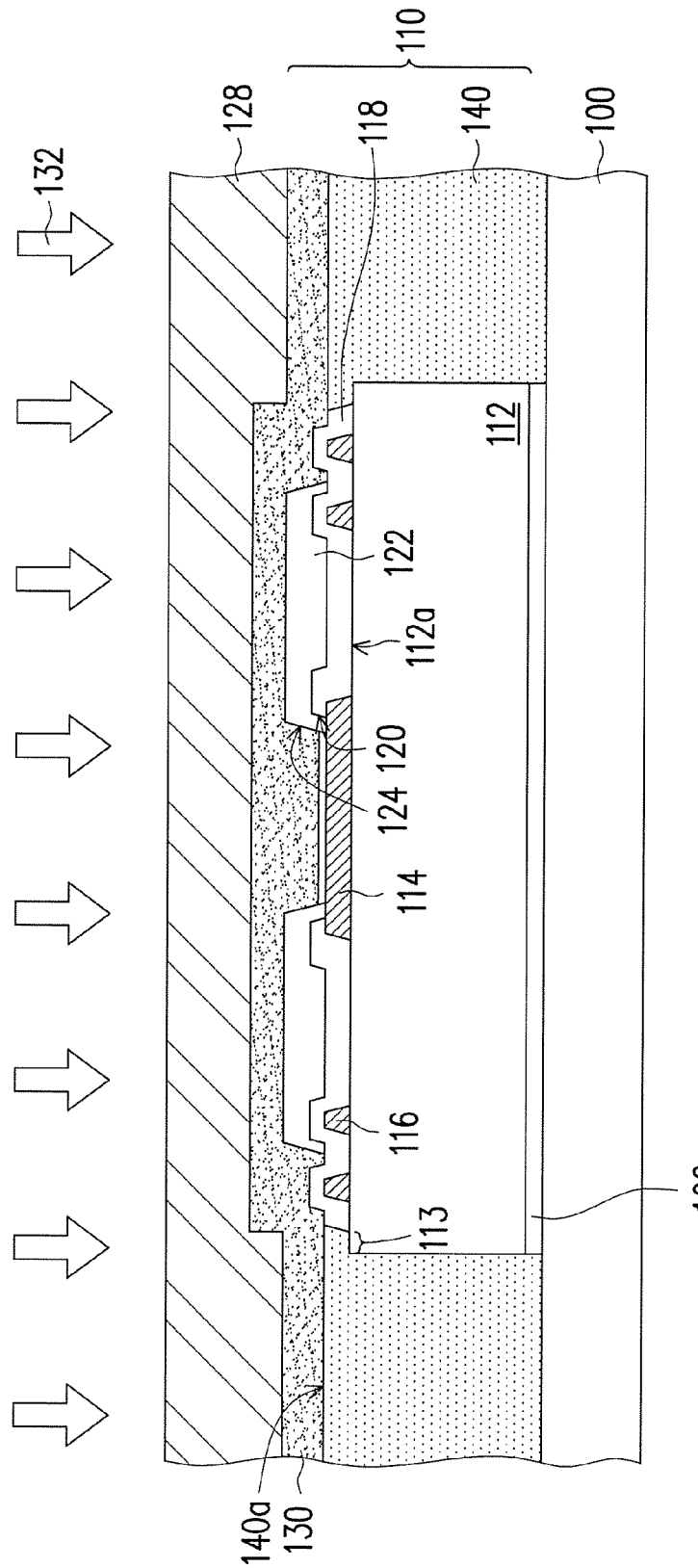

Referring to FIG. 1 and FIG. 2C, at step 30, the molding cavity 134 is filled with a molding compound to form a molding member 140, wherein a top surface 140a of the molding member 140 is higher than the top surface 112a of the semiconductor substrate 112. In some embodiments, with the release film 130 remaining being pushed against the top portion of the polymer layer 122, the molding cavity 134 is filled with a liquid molding compound, and then a curing step is performed to cure and solidify liquid molding compound. A material of the molding member 140 may include a resin or other types of dielectric encapsulating material. The liquid molding compound, after being solidified, is referred to as the molding member 140. In some embodiments, the curing is performed at a temperature between about 190° C. and about 220° C., for example, for a period of time between about 60 minutes and about 90 minutes. The curing temperature may be adjusted depending on the material of the molding member. In some embodiments, the molding member 140 has a thickness greater than the semiconductor substrate 112, and forms a hooking structure that embraces over the edge portion (e.g., 113) of the semiconductor substrate 112. In detail, a portion of the molding member 140 is hung on the edge portion (e.g., 113) of the semiconductor substrate 112, and thus the molding member 140 looks like a hook. In some embodiments, the hooking structure of the molding member 140 is contact with the edge portion (e.g., 113) of the semiconductor substrate 112 and the sidewall of the passivation layer 118.

Figure 2D:
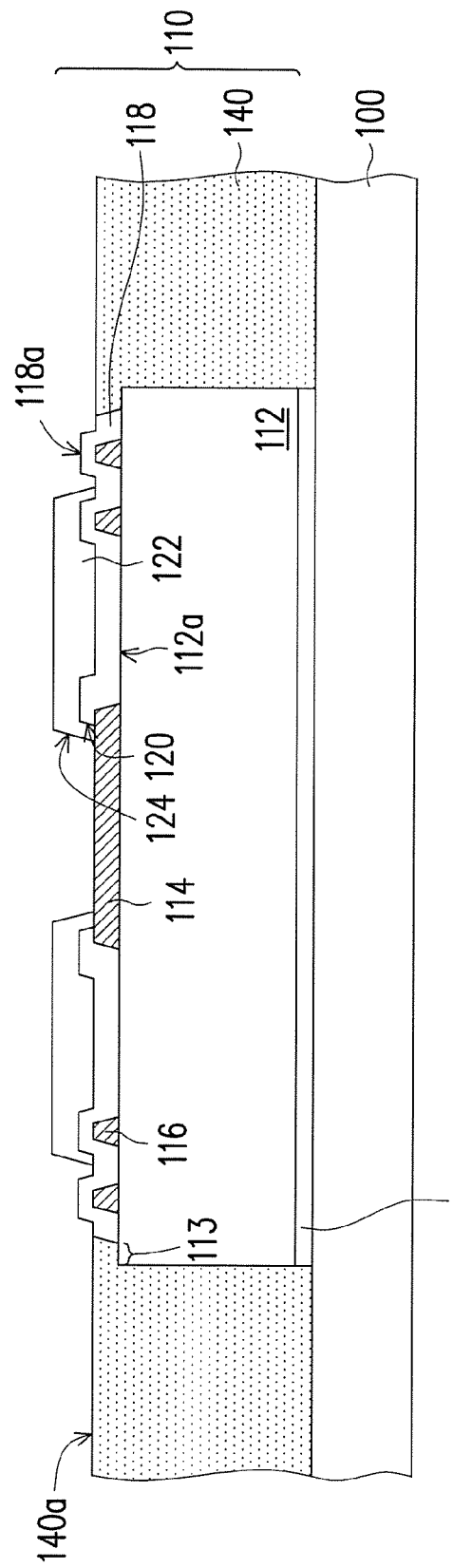

Referring to FIG. 1 and FIG. 2D, at step 40, the release film 130 is then peeled off from the molding member 140, which is now in a solid form. The resulting structure is shown in FIG. 2D. In some embodiments, the top surface 140a of the molding member 140 is disposed between the top surface 112a of the semiconductor substrate 112 and a top surface 118a of the passivation layer 118. In some embodiments, a portion of the top surface 112a of the semiconductor substrate 112 is covered by the molding member 140. In some embodiments, the edge portion 113 of the top surface 112a, which is exposed by the passivation layer 118, is sealed by the molding member 140.

In alternative embodiments, the molding member 140 may include fillers therein, which are pre-mixed into the liquid molding compound before it is filled into the molding cavity 134. In some embodiments, the fillers include the particles of $Al_2O_3$, $SiO_2$, $TiO_2$, and/or the like. The diameters (sizes) of the fillers may be smaller than about 20 μm. The uniform distribution of the fillers may result in a uniform distribution of stresses in the liquid molding compound.

Figure 2E:
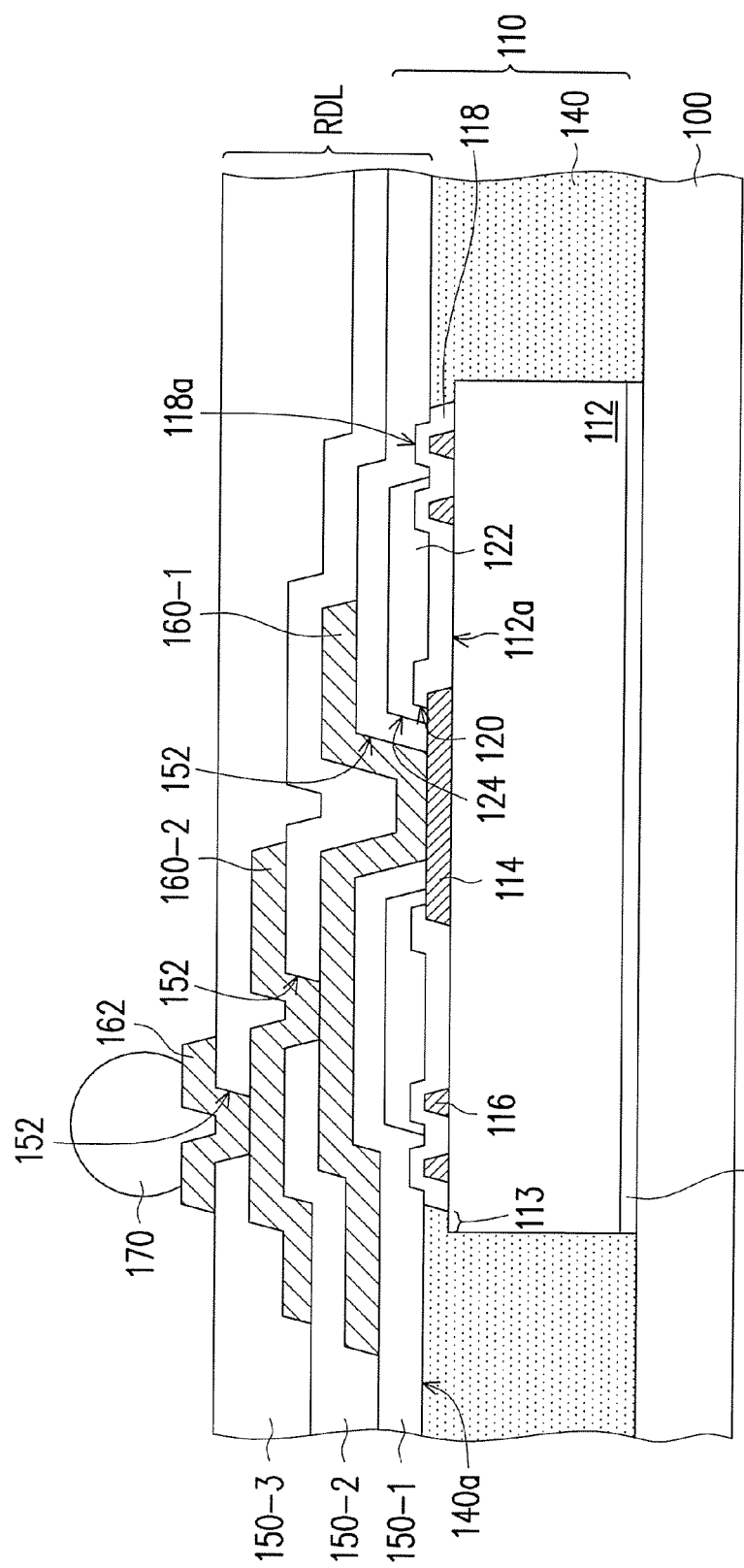

Referring to FIG. 1 and FIG. 2E, at step 50, after the molding member 140 is formed, a redistribution circuit structure RDL is formed over the die 110 and the molding member 140. The redistribution circuit structure RDL is fabricated to electrically connect with at least one connector underneath. Here, the afore-said connector(s) may be the connector 114 over the semiconductor substrate 112. The redistribution circuit structure RDL includes at least one conductive layer 160-1, 160-2, and the conductive layer 160-1, 160-2 includes at least one conductive line and at least one via. The fabrication of the redistribution circuit structure RDL includes the following steps. First, an insulating layer 150-1 is formed on the molding member 140 and the polymer layer 122, wherein an opening 152 in the insulating layer 150-1 expose the connector 114. In some embodiments, the insulating layer 150-1 covers an edge portion of the polymer layer 122. In some embodiments, the opening 152 of the insulating layer 150-1 is disposed in the opening 124 of the polymer layer 122. Then, a patterned conductive layer 160-1 (e.g., the lowest conductive layer) is formed in the opening 152 of the insulating layer 150-1 to electrically connect to the connector 114. In some embodiments, an insulating layer 150-2 is formed on the insulating layer 150-1, wherein an opening 152 in the insulating layer 150-2 expose the patterned conductive layer 160-1. Thereafter, a patterned conductive layer 160-2 is formed in the opening 152 of the insulating layer 150-2 to electrically connect to the patterned conductive layer 160-1. In some embodiments, an insulating layer 150-3 is formed on the insulating layer 150-2, and an opening 152 in the insulating layer 150-3 exposes the patterned conductive layer 160-2. In other words, after the insulating layer 150-1 and the patterned conductive layer 160-1 are formed, steps of forming the insulating layer and the patterned conductive layers can be repeated at least one time so as to fabricate the redistribution circuit structure RDL over the semiconductor substrate 112 and/or the molding member 140. In some embodiments, the redistribution circuit structure RDL may include a copper-containing layer including copper or copper alloys. In alternative embodiments, the redistribution circuit structure RDL includes a nickel-containing layer, a palladium-containing layer, and/or the like, in additional to the copper-containing layer.

In some embodiments, at least one of the patterned conductive layers 160-1, 160-2 of the redistribution circuit structure RDL extends over the die 110 and the molding member 140. In some embodiments, the lowest conductive layer 160-1, which is closest to the die 110, of the redistribution circuit structure RDL continuously traverses across the die 110 and the molding member 140. In some embodiments, a line width of at least one of the patterned conductive layers 160-1, 160-2 is smaller than 5 um. In some embodiments, a thickness of at least one of the patterned conductive layers 160-1, 160-2 is smaller than 4 um. In some embodiments, at least one of the patterned conductive layers 160-1, 160-2 is formed conformally with the molding member 140 and the polymer layer 122 therebeneath. The number of the insulating layers and the patterned conductive layers is not limited in this disclosure.

As shown in FIG. 2E, in some embodiments, the topmost patterned conductive layer of the redistribution circuit structure RDL may include at least one under-ball metallurgy (UBM) pattern 162 for electrically connecting with conductive ball and/or at least one connection connector (not shown) for electrically connecting with at least one passive component. The number of the under-ball metallurgy pattern 162 and the connection connector is not limited to the illustrated example in this disclosure.

Referring to FIG. 1 and FIG. 2E, in some embodiments, an electrical connector 170 is placed on the under-ball metallurgy pattern 162, wherein the electrical connector 170 may be a solder ball. The electrical connector 170 may be formed of a Sn—Ag alloy, a Sn—Ag—Cu alloy, or the like, and may be lead-free or lead-containing. After the placement, the electrical connector 170 is reflowed. The top surface of the electrical connector 170 thus has a spherical shape. In some embodiments, the electrical connector 170 may be placed over the under-ball metallurgy pattern by a ball placement process.

Figure 2F:
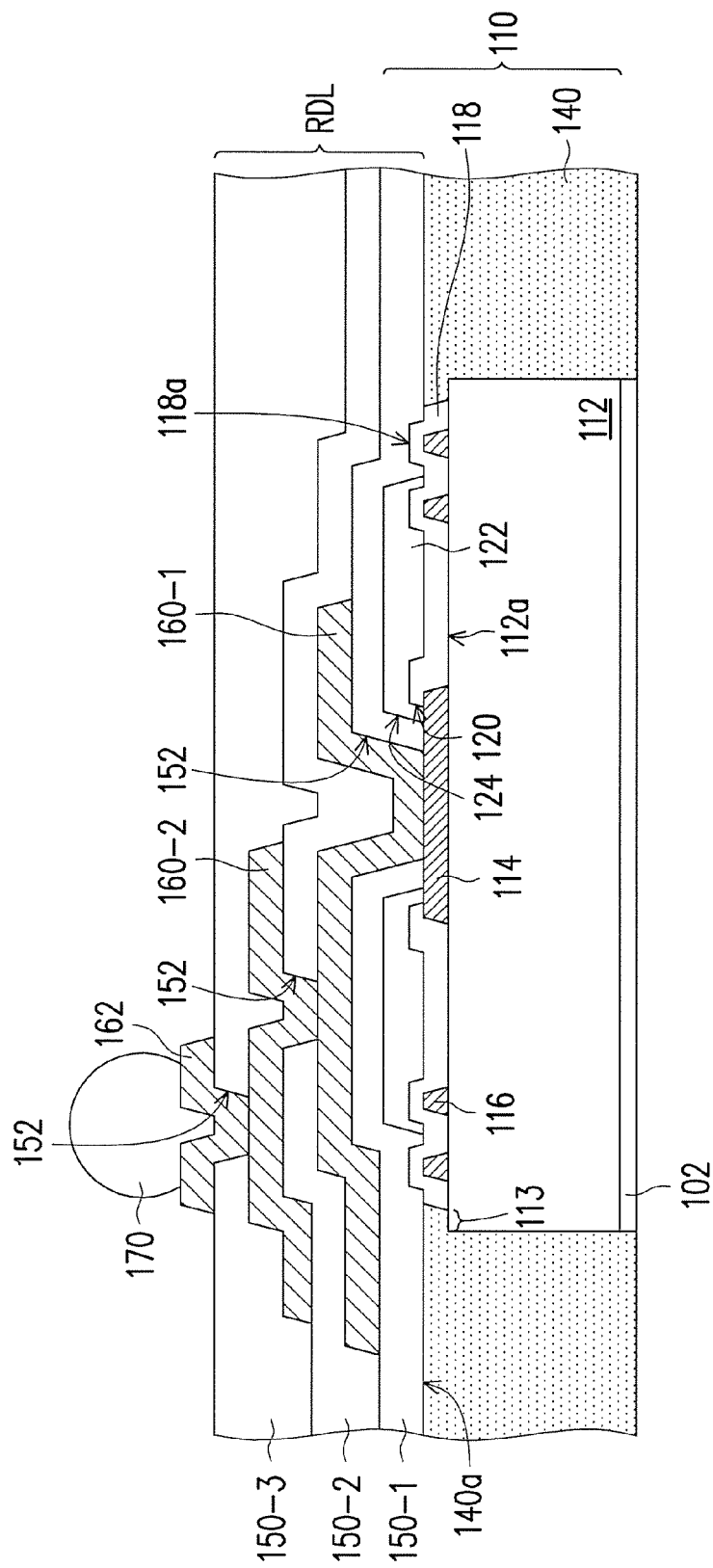

Referring to FIG. 1 and FIG. 2F, in some embodiments, after the electrical connector 170 is formed, the carrier 100 is removed. In some embodiments, the formed structure is de-bonded from the glue layer 102 such that the formed structure is separated from the carrier 100. In some embodiments, the formed structure is peeled from the carrier 100. In alternative embodiments, the formed structure de-bonded from the carrier 100 may be electrically connected to another package.

In alternative embodiments, a plurality of dies 110 is placed on the carrier 100. In alternative embodiments, the die 110 is substantially a die region which is not sawed from a wafer, and thus a die saw step is performed after forming the molding member or the electrical connector.

Conventionally, the top surface of the molding member is lower than the top surface of the semiconductor substrate, and a height difference between the top surface of the molding member and the top surface of the polymer layer is large. Accordingly, the redistribution circuit structure (e.g., the lowest patterned conductive layer) continuously extending over or traversing across the molding member and the polymer layer may be easily broken at the region between the molding member and the polymer layer, particularly during temperature cycling. In some embodiments, the top surface of the molding member is higher than the top surface of the semiconductor substrate, and the edge portion of the die is sealed by the molding member. Accordingly, a step height between the molding member and the polymer layer is reduced, and the redistribution circuit structure (e.g., the lowest patterned conductive layer 160-1 in FIG. 2F) is prevented from being broken. Moreover, since the molding member is formed over the edge portion of the top surface of the semiconductor substrate, the stress at the edge of the semiconductor substrate causing from the interface among the molding member, the semiconductor substrate and the lowest insulating layer (e.g., the insulating layer 150-1 in FIG. 2F) may be reduced, and a better delamination window is obtained. Thus, the reliability and the yield of the package structure are improved.

Figure 3A:
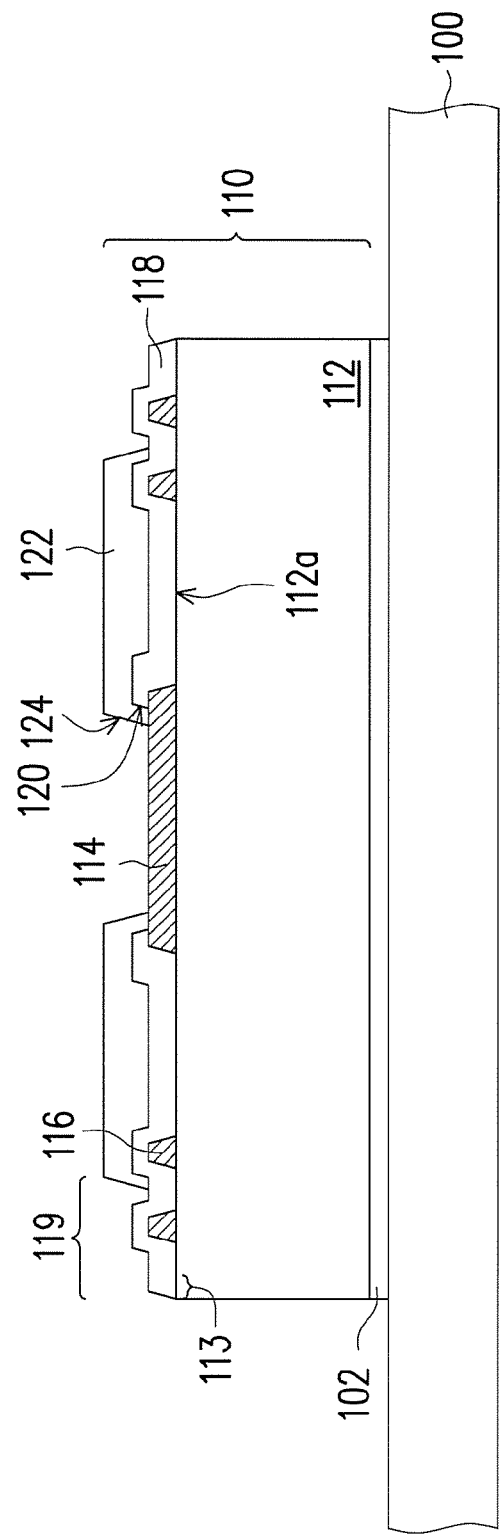
FIG. 3A to FIG. 3F illustrate cross-sectional views of a method of forming a package structure in accordance with some embodiments.

FIG. 3A to FIG. 3F illustrate cross-sectional views of a method of forming a package structure in accordance with some embodiments. The main difference between the process of FIG. 3A to FIG. 3E and the process of FIG. 2A to FIG. 2E lies in the molding member (e.g., 140 shown in FIG. 3C) further covers the passivation layer 118. Referring to FIG. 1 and FIG. 3A, at step 10, a die 110 is provided onto a carrier 100. In some embodiments, a passivation layer 118 is formed to cover an edge portion of a connector 114 and an edge portion 113 of a top surface 112a of a semiconductor substrate 112. In some embodiments, a polymer layer 122 extends into an opening 120 in the passivation layer 118. In some embodiments, an edge portion 119 of the passivation layer 118 is exposed by the polymer layer 122.

Figure 3B:
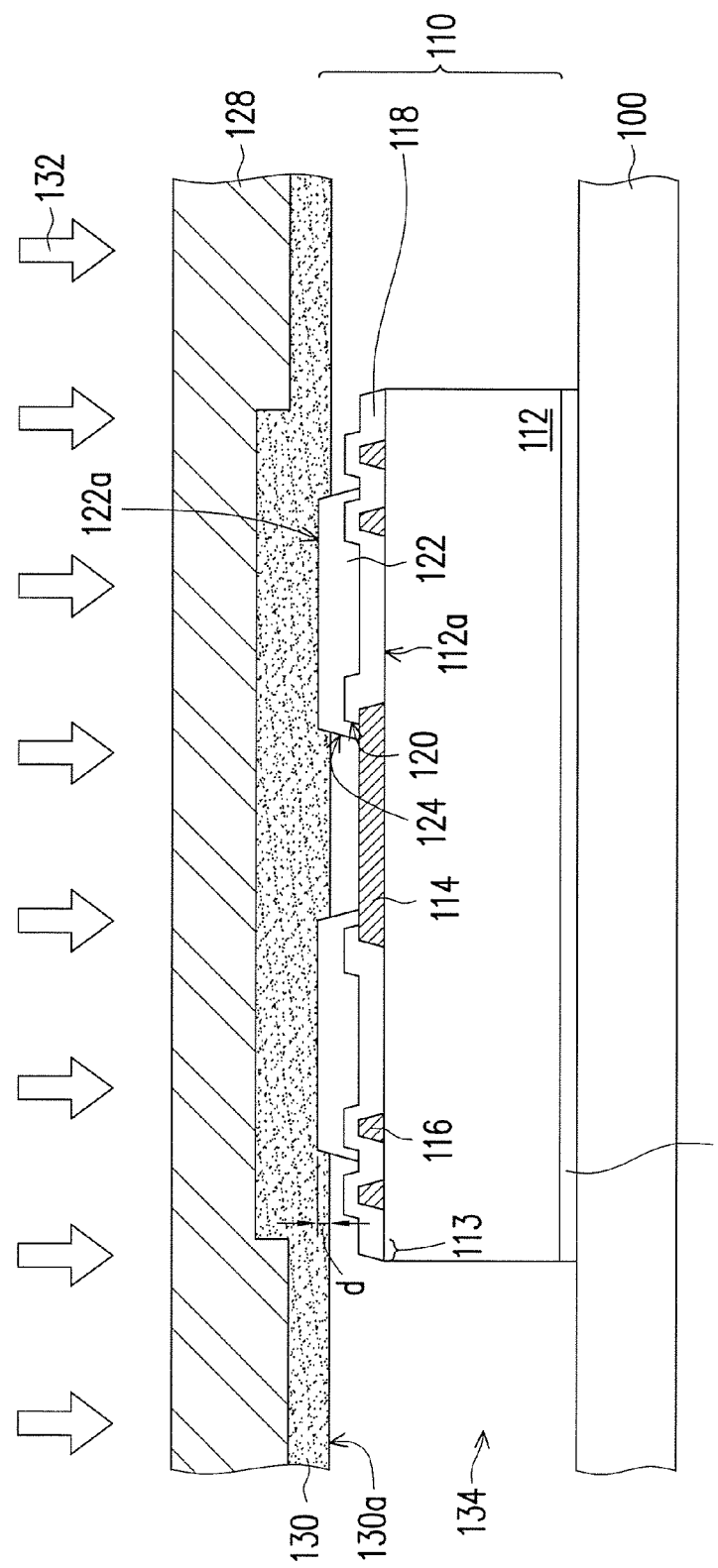

Referring to FIG. 1 and FIG. 3B, at step 20, a release film 130 is applied over the die 110 and is pressed against the polymer layer 122 to define a molding cavity 134. In some embodiments, the molding cavity 134 is defined by a lower surface 130a of the release film 130, a sidewall of the passivation layer 118, a sidewall of the polymer layer 122, a sidewall of the semiconductor substrate 112 and a top surface of the carrier 100. In detail, a pressure, as shown as an arrow 132, is applied on a mould 128. In some embodiments, by controlling the pressure applying to the mould 128, a distance d between the lower surface 130a of the release film 130 and the top surface 122a of the polymer layer 122 is less than 5 um.

Figure 3C:
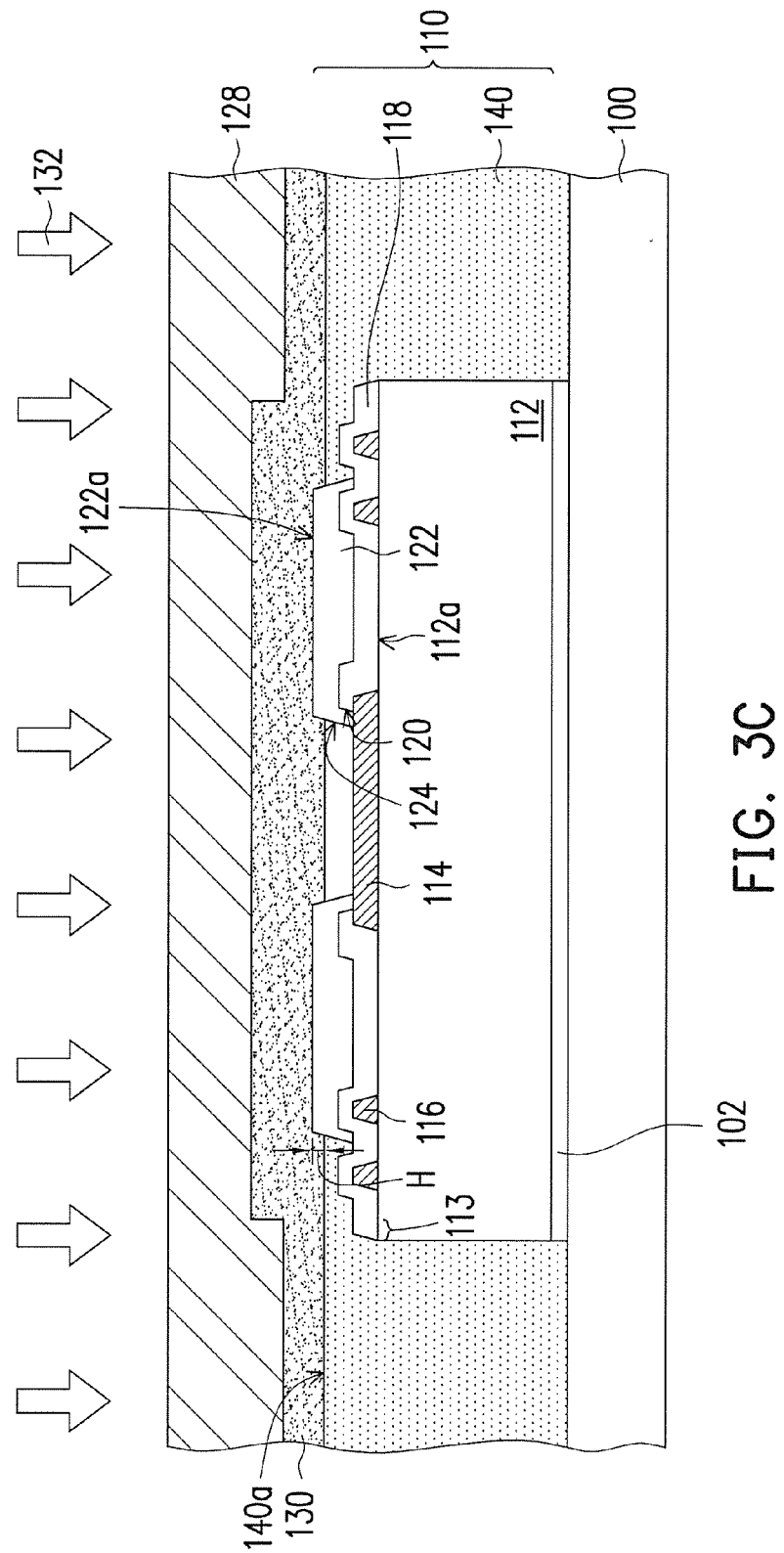

Referring to FIG. 1 and FIG. 3C, at step 30, the molding cavity 134 is filled with a molding compound to form a molding member 140, wherein a top surface 140a of the molding member 140 is higher than the top surface 112a of the semiconductor substrate 112. In some embodiments, the top surface 140a of the molding member 140 is disposed between a top surface 118a of the passivation layer 118 and the top surface 122a of the polymer layer 122. In some embodiments, a height difference H between the top surface 122a of the polymer layer 122 and the top surface 140a of the molding member 140 is less than 5 um. In some embodiments, a portion of the molding member 140 is hung on the edge portions of the semiconductor substrate 112 and the passivation layer 118, and thus the molding member 140 looks like a hook. In some embodiments, the hooking structure of the molding member 140 is contact with the edge portion and the sidewall of the passivation layer 118. In alternative embodiments, the hooking structure of the molding member 140 is contact with the edge portion of the semiconductor substrate 112 and the edge portion and the sidewall of the passivation layer 118.

Figure 3D:
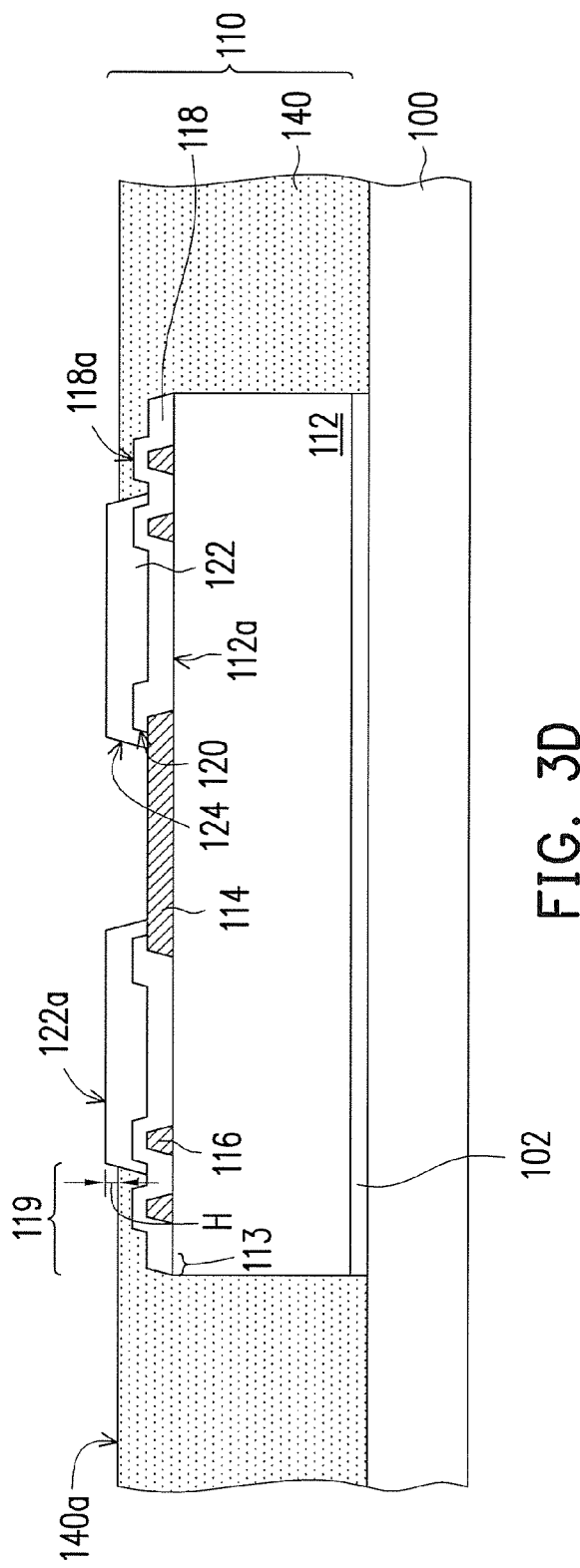

Referring to FIG. 1 and FIG. 3D, at step 40, the release film 130 is then peeled off from the molding member 140, which is now in a solid form. The resulting structure is shown in FIG. 3D. In some embodiments, the edge portion 119 of the passivation layer 118, which is exposed by the polymer layer 122, is sealed by the molding member 140.

Figure 3E:
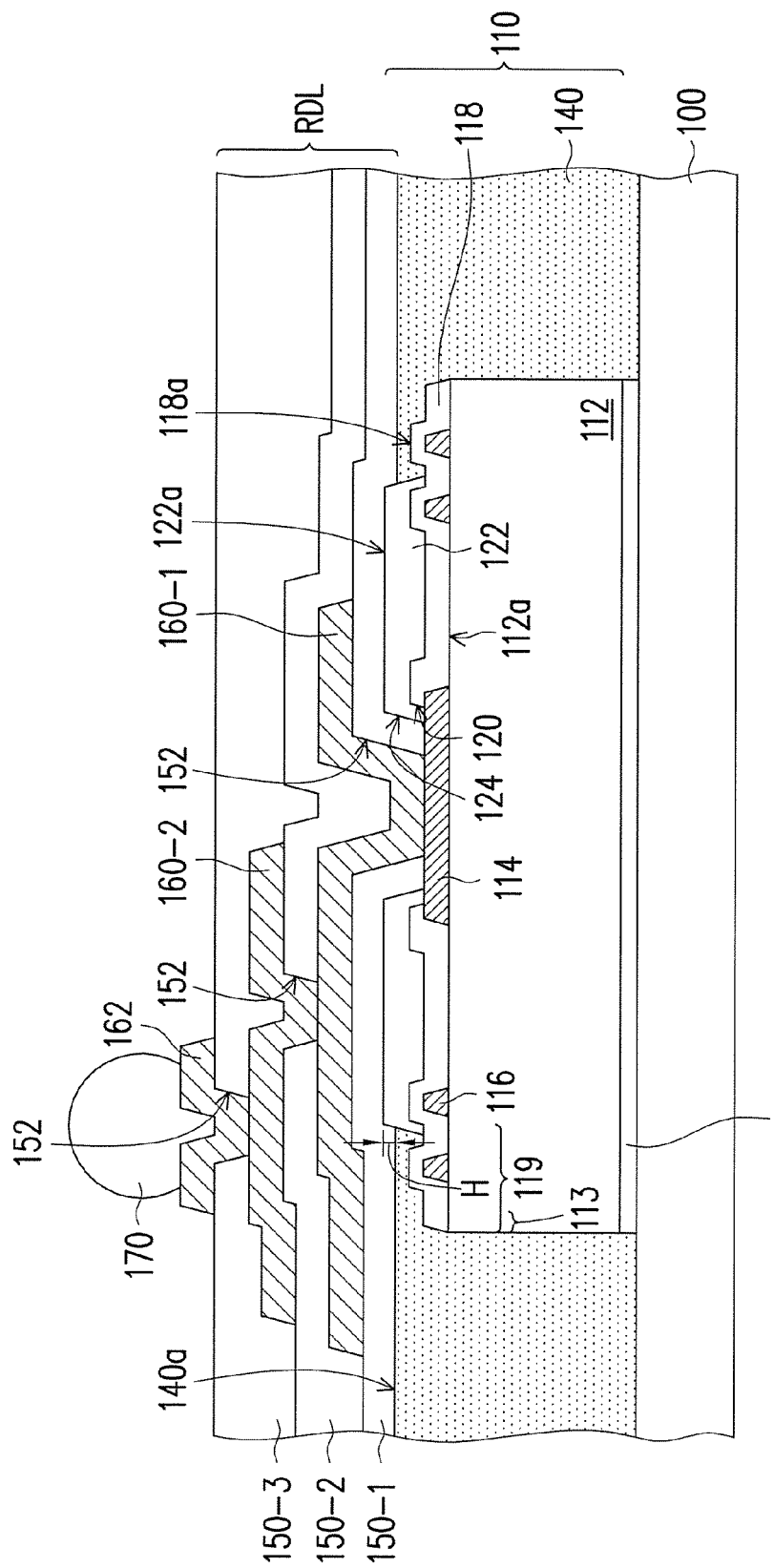

Referring to FIG. 1 and FIG. 3E, at step 50, after the molding member 140 is formed, a redistribution circuit structure RDL is formed over the die 110 and the molding member 140. Then, an electrical connector 170 is placed on the under-ball metallurgy pattern 162.

Figure 3F:
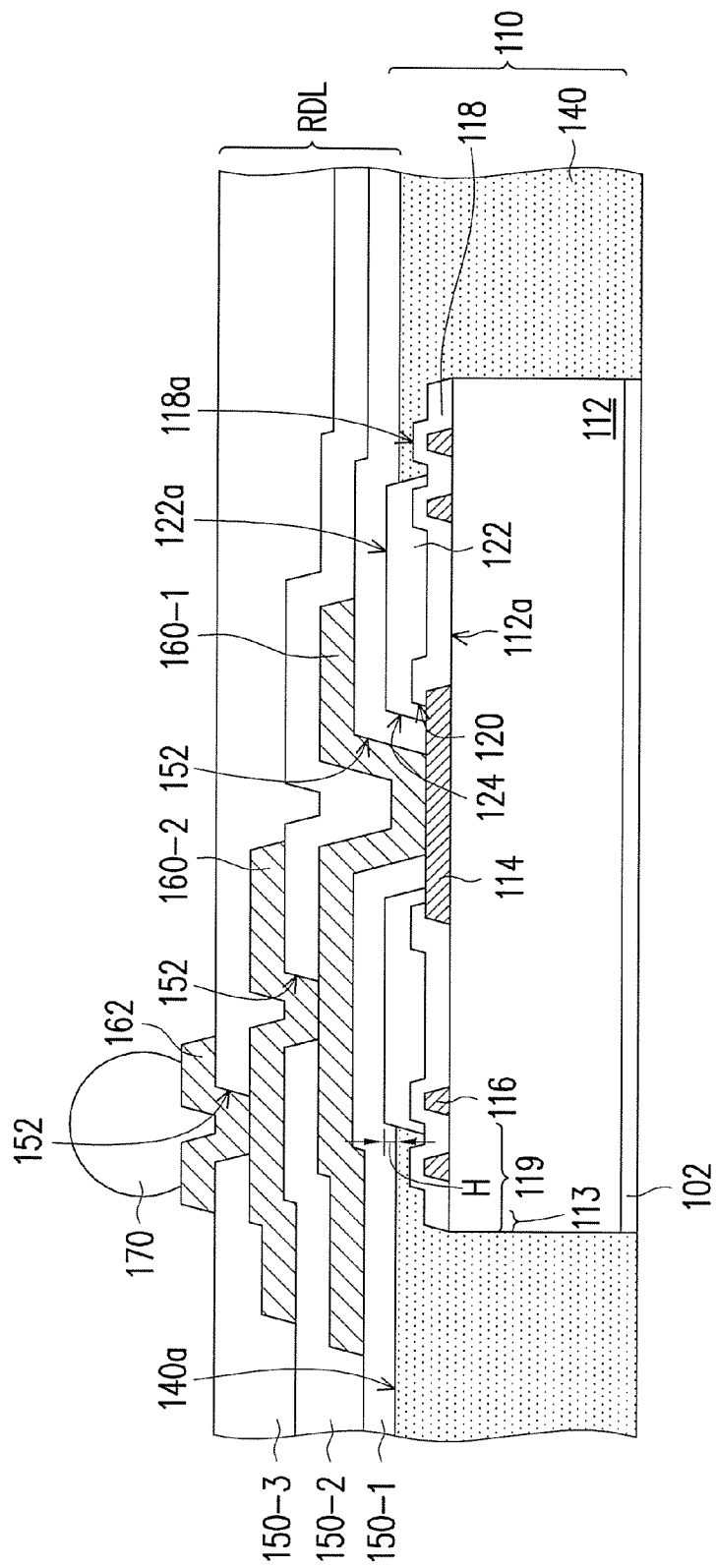

Referring to FIG. 1 and FIG. 3F, in some embodiments, after the electrical connector 170 is formed, the carrier 100 is removed.

In some embodiments, the height difference between the top surface of the polymer layer and the top surface of the molding member is less than 5 um, and a region between the edge of the semiconductor substrate and the edge of the polymer layer is sealed by the molding member. Accordingly, a step height between the molding member and the polymer layer is reduced, and the redistribution circuit structure continuously formed thereover is prevented from being broken. Thus, the reliability and the yield of the package structure are improved.

In view of the above, the present disclosure provides a package structure having a molding member with a top surface higher than a top surface of a semiconductor substrate. In some embodiments, the molding member covers at least a portion of the top surface of the semiconductor substrate and forms a hooking structure. In some embodiments, a height difference between the top surface of the polymer layer on the semiconductor substrate and the top surface of the molding member is less than 5 um. Accordingly, a step height between the molding member and the polymer layer is reduced, and the redistribution circuit structure such as conductive lines extending over the molding member and the polymer layer is prevented from being broken. Moreover, since the molding member is formed over the edge portion of the top surface of the semiconductor substrate, the stress at the edge of the semiconductor substrate causing from the interface among the molding member, the semiconductor substrate and the lowest insulating layer of the redistribution circuit structure may be reduced, and a better delamination window is obtained. Thus, the reliability and the yield of the package structure are improved.

In accordance with some embodiments of the present disclosure, a package structure includes a die, a molding member and a redistribution circuit structure. The die includes a semiconductor substrate, a connector and a passivation layer. The semiconductor substrate has a top surface. The connector is disposed over the top surface of the semiconductor substrate. The passivation layer is disposed over the top surface of the semiconductor substrate and exposes a portion of the connector. The molding member laterally surrounds the semiconductor substrate, wherein a top surface of the molding member is higher than the top surface of the semiconductor substrate and the molding member forms a hooking structure that embraces over an edge portion of the semiconductor substrate. The redistribution circuit structure extends over the molding member and the passivation layer, and is electrically connected to the connector.

In accordance with alternative embodiments of the present disclosure, a package structure includes a die, a molding member and a redistribution circuit structure. The die includes a semiconductor substrate, a connector over the semiconductor substrate, a passivation layer over the semiconductor substrate and exposing a portion of the connector, and a polymer layer over the passivation layer and exposing a portion of the connector. The molding member laterally surrounds the semiconductor substrate, wherein a top surface of the molding member is lower than a top surface of the polymer layer, and a height difference between the top surface of the molding member and the top surface of the polymer layer is less than 5 um. The redistribution circuit structure extends over the molding member and the polymer layer, and is electrically connected to the connector.

In accordance with yet alternative embodiments of the present disclosure, a method of forming a package structure includes at least the following steps. A die is provided, wherein the die comprises a semiconductor substrate, a connector over the semiconductor substrate, a passivation layer over the semiconductor substrate and exposing the connector and a polymer layer over the passivation layer and exposing the connector. A release film is applied over the die and the release film is pressed against the polymer layer to define a molding cavity among the release film, the passivation layer and the semiconductor substrate. The molding cavity is filled with a molding compound to form a molding member, wherein a top surface of the molding member is higher than a top surface of the semiconductor substrate. The release film is removed from the molding member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a die, comprising:
        a semiconductor substrate having a top surface;
        a connector over the top surface of the semiconductor substrate; and
        a passivation layer over the top surface of the semiconductor substrate and exposing a portion of the connector;
    a molding member laterally surrounding the semiconductor substrate, wherein a top surface of the molding member is higher than the top surface of the semiconductor substrate and the molding member forms a hooking structure that embraces over an edge portion of the semiconductor substrate;
    a redistribution circuit structure, extending over the molding member and the passivation layer, and electrically connected to the connector; and
    a polymer layer disposed between the redistribution circuit structure and the passivation layer, wherein the polymer layer exposes a portion of the connector, and a top surface of the molding member is not covered by the polymer layer and is lower than a top surface of the polymer layer.

2. The package structure of claim 1, wherein the top surface of the molding member is disposed between the top surface of the semiconductor substrate and a top surface of the passivation layer.

3. The package structure of claim 1, wherein the passivation layer exposes a portion of the top surface of the semiconductor substrate.

4. The package structure of claim 1, wherein the molding member covers an edge portion of the top surface of the semiconductor substrate.

5. The package structure of claim 1, wherein the redistribution circuit structure is formed conformally with the molding member and the polymer layer therebeneath.

6. The package structure of claim 1, wherein the die further comprises a seal ring over an edge portion of the top surface of the semiconductor substrate, and the passivation covers the seal ring.

7. A package structure, comprising:
    a die, comprising:
        a semiconductor substrate;
        a connector over the semiconductor substrate;
        a passivation layer over the semiconductor substrate and exposing a portion of the connector; and
        a polymer layer over the passivation layer and exposing a portion of the connector;
    a molding member laterally surrounding the semiconductor substrate, wherein a top surface of the molding member is lower than a top surface of the polymer layer, and a height difference between the top surface of the molding member and the top surface of the polymer layer is less than 5 um; and
    a redistribution circuit structure, extending over the molding member and the polymer layer, and electrically connected to the connector.

8. The package structure of claim 7, wherein the top surface of the molding member is disposed between a top surface of the passivation layer and the top surface of the polymer layer.

9. The package structure of claim 7, wherein the molding member covers a portion of the passivation layer.

10. The package structure of claim 9, wherein the portion of the passivation layer is disposed over an edge portion of the semiconductor substrate.

11. The package structure of claim 9, wherein the portion of the passivation layer is exposed by the polymer layer.

12. The package structure of claim 7, wherein the redistribution circuit structure is formed conformally with the molding member and the polymer layer therebeneath.

13. The package structure of claim 7, wherein the die further comprises a seal ring over an edge portion of the top surface of the semiconductor substrate, and the passivation covers the seal ring.

14. A method of forming a package structure, comprising:
    providing a die, wherein the die comprises a semiconductor substrate, a connector over the semiconductor substrate, a passivation layer over the semiconductor substrate and exposing the connector, and a polymer layer over the passivation layer and exposing the connector;
    applying a release film over the die and pressing the release film against the polymer layer to define a molding cavity among the release film, the passivation layer and the semiconductor substrate;
    filling the molding cavity with a molding compound to form a molding member, wherein a top surface of the molding member is higher than a top surface of the semiconductor substrate; and
    removing the release film from the molding member.

15. The method of claim 14, wherein the molding cavity is further defined by the release film, the passivation layer, the polymer layer and the semiconductor substrate.

16. The method of claim 14, wherein a height difference between the top surface of the polymer layer and the top surface of the molding member is less than 5 um.

17. The method of claim 14, further comprising conformally forming a redistribution circuit structure over the polymer layer and the molding member to electrically connect the connector.

18. The method of claim 14, wherein the molding member is formed to cover an edge portion of a top surface of the semiconductor substrate.

19. The method of claim 14, wherein the molding member is formed to cover an edge portion of the passivation layer.

* * * * *